(12) United States Patent
Sun et al.

(10) Patent No.: US 10,680,203 B2
(45) Date of Patent: Jun. 9, 2020

(54) MASK PLATE, DISPLAY PANEL AND ENCAPSULATING METHOD THEREOF

(71) Applicant: BOE TECHNOLOGY GROUP CO., LTD., Beijing (CN)

(72) Inventors: Tao Sun, Beijing (CN); Youwei Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/325,954

(22) PCT Filed: May 11, 2018

(86) PCT No.: PCT/CN2018/086497
§ 371 (c)(1),
(2) Date: Feb. 15, 2019

(87) PCT Pub. No.: WO2018/223806
PCT Pub. Date: Dec. 13, 2018

(65) Prior Publication Data
US 2019/0181381 A1    Jun. 13, 2019

(30) Foreign Application Priority Data

Jun. 7, 2017   (CN) ........................ 2017 1 0423199

(51) Int. Cl.
*H01L 51/52*   (2006.01)
*H01L 51/56*   (2006.01)
*H01L 27/32*   (2006.01)

(52) U.S. Cl.
CPC .......... *H01L 51/5253* (2013.01); *H01L 27/32* (2013.01); *H01L 51/56* (2013.01); *H01L 2251/566* (2013.01)

(58) Field of Classification Search
CPC ..... H01L 51/56; H01L 51/5253; H01L 27/32; H01L 2251/566
(Continued)

(56) References Cited

U.S. PATENT DOCUMENTS

2012/0091477 A1* 4/2012 Kim .................... H01L 51/5246
                                                                  257/88
2012/0313516 A1    12/2012 Kim et al.
(Continued)

FOREIGN PATENT DOCUMENTS

CN    102664239 A    9/2012
CN    104022233 A    9/2014
(Continued)

OTHER PUBLICATIONS

International Search Report and Written Opinion in corresponding International Patent Application No. PCT/CN2018/086497 dated Jul. 27, 2018 (an English translation attached hereto). 14 pages.
(Continued)

*Primary Examiner* — Igwe U Anya
(74) *Attorney, Agent, or Firm* — Leason Ellis LLP

(57) ABSTRACT

A mask plate, a display panel and an encapsulating method thereof, which are used for reducing the width of an edge of a packaging film layer, thereby realizing a narrow bezel. The mask plate includes a first blocking area, a first opening area and at least one encapsulation control area, wherein an edge of an orthographic projection, on a display panel, of the first opening area surrounds a display area of the display panel; the encapsulation control area surrounds the first opening area, and includes a plurality of second opening areas and a plurality of second blocking areas which are arranged alternatively; the first blocking area surrounds the first opening (Continued)

area, is between the first opening area and the encapsulation control area, and has no overlapping area with the encapsulation control area.

17 Claims, 5 Drawing Sheets

(58) Field of Classification Search
USPC .......................................................... 257/40
See application file for complete search history.

(56) References Cited

U.S. PATENT DOCUMENTS

| | | |
|---|---|---|
| 2013/0334959 A1 | 12/2013 | Wang et al. |
| 2014/0170785 A1* | 6/2014 | Kurita .................... C23C 16/042 438/26 |
| 2016/0104862 A1 | 4/2016 | Li |
| 2016/0141550 A1 | 5/2016 | Fujino et al. |
| 2016/0293901 A1* | 10/2016 | Ciou .................... H01L 51/0023 |
| 2016/0365395 A1 | 12/2016 | Xu et al. |
| 2017/0092861 A1 | 3/2017 | Lin |
| 2017/0271623 A1 | 9/2017 | Wang et al. |
| 2018/0019441 A1* | 1/2018 | Noh .................... H01L 51/5256 |

FOREIGN PATENT DOCUMENTS

| | | |
|---|---|---|
| CN | 203883009 U | 10/2014 |
| CN | 104393195 A | 3/2015 |
| CN | 104651778 A | 5/2015 |
| CN | 104900681 A | 9/2015 |
| CN | 105374946 A | 3/2016 |
| CN | 106444274 A | 2/2017 |
| CN | 106567052 A | 4/2017 |
| CN | 106684256 A | 5/2017 |
| CN | 107248520 A | 10/2017 |
| EP | 2747162 A1 | 6/2014 |

OTHER PUBLICATIONS

Chinese Office Action in corresponding Chinese Application No. 201710423199.2 dated Jul. 1, 2019 (an English translation attached hereto). 12 pages.

* cited by examiner

MASK PLATE, DISPLAY PANEL AND ENCAPSULATING METHOD THEREOF

This application is a U.S. National Stage Application under 35 U.S.C. § 371 of International Patent Application No. PCT/CN2018/086497, filed May 11, 2018, which claims the benefit of priority to Chinese Patent Application No. 201710423199.2, filed on Jun. 7, 2017, both of which are incorporated herein by reference in their entireties.

TECHNICAL FIELD

Embodiments of the present disclosure relate to a mask plate, an organic electroluminescent display panel and an encapsulation method thereof.

BACKGROUND

Organic Light Emitting Diode (OLED) devices emit light autonomously through organic layers, do not need backlights and do not need to be in display by the optical characteristics of liquid crystals, so OLED devices have a faster response time, a greater viewing angle, higher contrast, a lighter weight and a lower power consumption, and are considered to be the most promising flat panel display devices.

When the OLED device operates, electrons are injected from a cathode to a transporting layer. To increase the number of injected carriers and to improve the luminous efficiency, the material used for the cathode of the OLED has an approximate work function to the light-emitting layer to reduce the energy barrier, and the low work function metals such as magnesium, aluminum and silver are all active materials which are prone to react with water and oxygen in the environment, thereby rendering the device dysfunctional. Besides, the hole transporting layer and the electron transporting layer of the OLED device are easily corroded by water and oxygen, and thus the pixels are damaged and the service life of the device is shortened.

SUMMARY

The embodiments of the present disclosure provide a mask plate, an organic electroluminescent display panel and an encapsulation method thereof to reduce a width of an edge of an encapsulation film layer, thereby achieving a narrow bezel.

The embodiments of the present disclosure provides a mask plate for encapsulating a substrate, a plurality of organic electroluminescent display panels being in an array arrangement on the substrate, the mask plate including a first blocking area, a first opening area and at least one encapsulation control area at a position corresponding to each of the organic electroluminescent display panels. An edge of an orthographic projection area of the first opening area on the organic electroluminescent display panel surrounds a display area of the organic electroluminescent display panel; the encapsulation control area surrounds the first opening area, and includes a plurality of second opening areas and a plurality of second blocking areas which are arranged alternatively; the first blocking area surrounds the first opening area, is at least between the first opening area and the encapsulation control area, and has no overlapping area with the encapsulation control area; and the first blocking area and the second blocking areas satisfy following conditions: after encapsulating is carried out by using the mask plate, an encapsulation layer is formed in a continuous curved shape.

For example, an orthographic projection area of the encapsulation control area on the organic electroluminescent display panel has no overlapping area with a circuit bonding area of the organic electroluminescent display panel.

For example, a shape of an edge of the first opening area is a rectangle, one side of the rectangle corresponds to the circuit bonding area, and the encapsulation control area surrounds remaining three sides of the rectangle.

For example, in a case where an amount of the encapsulation control areas is greater than one, the encapsulation control areas extend outward centering on a center of the first opening area, and in a preset direction, distances between adjacent encapsulation control areas are identical.

For example, the first blocking area is between the first opening area and the encapsulation control area, and is between adjacent encapsulation control areas.

For example, areas of orthographic projections of the encapsulation control areas on the organic electroluminescent display panel are identical to each other.

For example, a distance between the edge of the orthographic projection area of the first opening area on the organic electroluminescent display panel and an edge of the display area is 10 microns to 200 microns.

For example, a distance between an edge of the first opening area and an edge of the encapsulation control area closest to the first opening area is 10 microns to 300 microns.

Another embodiment of the present disclosure further provides a method of encapsulating an organic electroluminescent display panel, including an encapsulation process of an inorganic encapsulation layer and an encapsulation process of an organic encapsulation layer, wherein at least one inorganic encapsulation layer is formed by using the above mask plate; and/or, at least one organic encapsulation layer is formed by using the above mask plate.

Another embodiment of the present disclosure further provides an organic electroluminescent display panel, including an anode layer, a light-emitting layer, a cathode layer, an inorganic encapsulation layer and an organic encapsulation layer, wherein at least one inorganic encapsulation layer is formed by the above encapsulation method; and/or, at least one organic encapsulation layer is formed by the above encapsulation method.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

Figure 1:
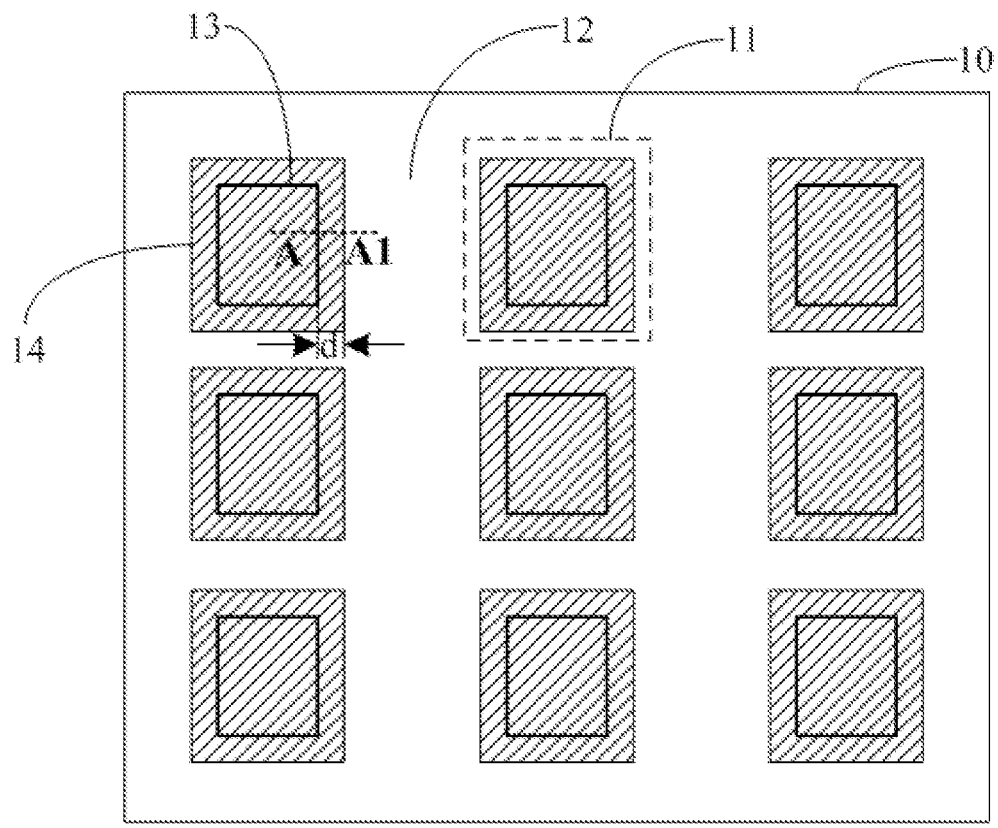
FIG. 1 is a planar schematic structural diagram of an orthographic projection of a mask plate on organic electroluminescent display panels.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An effective encapsulation process is required for the OLED device to prevent active metals and organic layers from being corroded, and the effective encapsulation process can prevent the immersion of moisture and oxygen, thereby extending the service life of the OLED device.

The encapsulation technologies of the flexible OLED device mainly include a cover-plate encapsulation technology and a thin-film encapsulation technology, and the thin film encapsulation technology mainly includes encapsulating using organic encapsulation layers inorganic encapsulation layers. During the encapsulation process, the organic encapsulation layers and the inorganic encapsulation layers are stacked at intervals, the organic encapsulation layer is generally formed by inkjet printing, and the inorganic encapsulation layer is generally formed by coating. Therefore, a mask plate is generally required when the inorganic encapsulation layer is formed. The opening area of the mask plate corresponds to the area to be encapsulated, and the area which is not required and not desired to be coated is blocked by the mask plate, for example, the circuit bonding area of the flexible OLED device is blocked by the mask plate.

Figure 2:
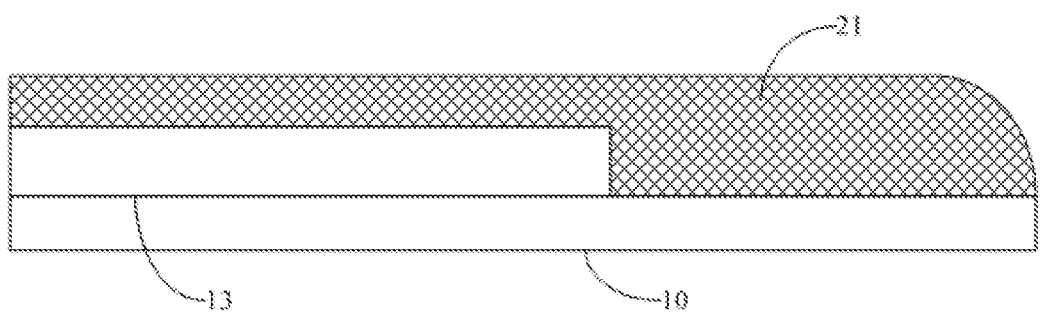
FIG. 2 is a cross-sectional schematic structural diagram of an encapsulation layer that is formed after the organic electroluminescent display panel is encapsulated by using the mask plate illustrated in FIG. 1.

FIG. 1 is a schematic diagram of OLED devices encapsulated by inorganic encapsulation layers. A substrate 10 to be encapsulated includes a plurality of OLED display panels 11 in an array arrangement, an orthographic projection area of a mask plate used in the encapsulation process on the substrate 10 to be encapsulated are overlapped with the substrate 10 to be encapsulated, 14 refers to an orthographic projection area of an opening area of the mask plate on the substrate 10 to be encapsulated, 13 refers to a display area of the OLED display panel 11, 12 refers to a cutting area between two adjacent OLED display panels 11, a cross-sectional diagram along an AA1 direction in FIG. 1 is illustrated in FIG. 2, and 21 refers to an inorganic encapsulation layer after the encapsulation process.

In the encapsulation process, a size of the opening area of the mask plate is designed according to the specifications of the display area of the OLED display panel 11 to be encapsulated. In order to ensure the encapsulation effect, a distance d between an edge of the orthographic projection area of the opening area of the mask plate on the substrate 10 to be encapsulated and an edge of the display area of the OLED display panel 11 is at least 1000 microns.

In the practical coating process, the mask plate and the OLED display panel 11 are not completely in contact, and there is a certain space between the mask plate and the OLED display panel 11. In the coating process, the reaction gas flows inside the process chamber, and the inorganic encapsulation layer may be generated at any position where the reaction gas reaches. Therefore, the inorganic encapsulation layer is also formed in the area where coating is not desired, that is, a mask shadow is generated in practical coating process. The extending range of the mask shadow is above 300 microns. The mask shadow extends the width of the encapsulation layer at the edge, and is not conducive to achieving a narrow bezel.

In addition, as illustrated in FIG. 1, the area of the mask shadow may extend to the cutting area 12 between two adjacent OLED display panels 11, and the cutting process subsequent to the encapsulation process may cut the film layer in the area of the mask shadow, thereby destroying the structure of the encapsulation layer and having a risk of encapsulation failure.

The embodiments of the present disclosure provide a mask plate, an organic electroluminescent display panel and an encapsulation method thereof, which may reduce a width of an edge of an encapsulation film layer, thereby achieving a narrow bezel.

The mask plate provided by the embodiments of the present disclosure is described in detail in the following with reference to the accompanying drawings. The thickness, area and shape of each film layer in the drawings do not represent real scales of each film layer, and are only intended to illustrate the contents of the present disclosure.

Figure 3:
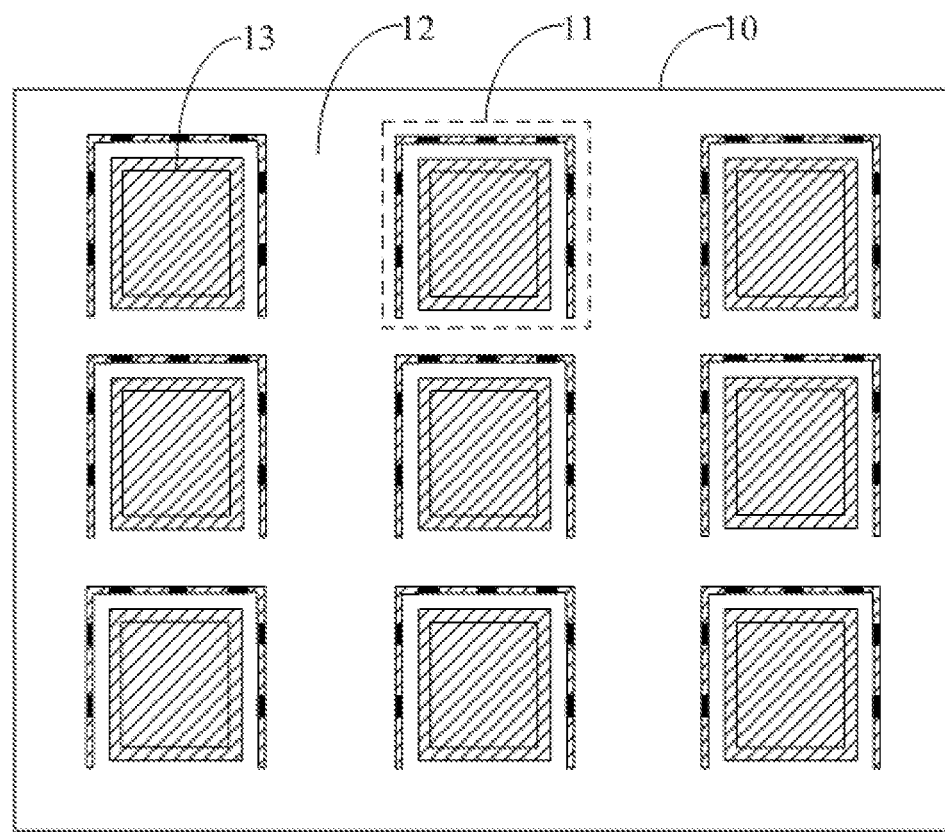
FIG. 3 is a planar schematic structural diagram of orthographic projections of a mask plate on organic electroluminescent display panels provided by the embodiments of the present disclosure.
Figure 4:
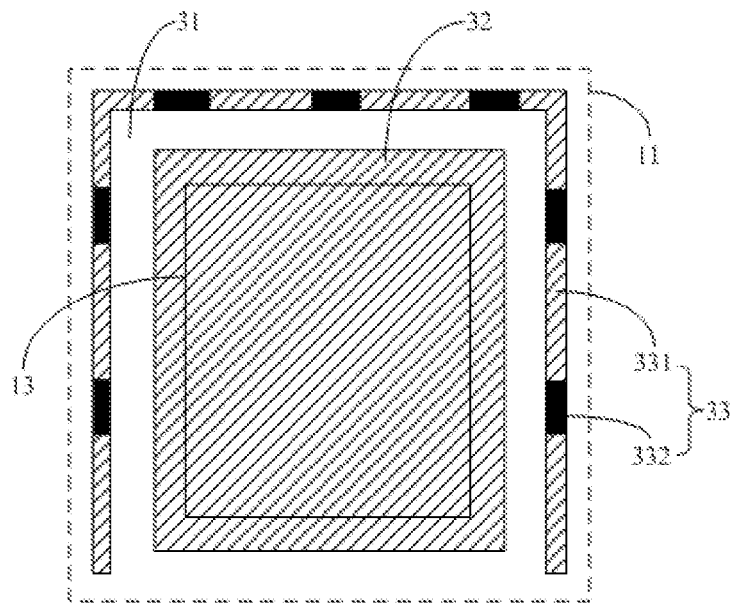
FIG. 4 is a planar schematic structural diagram of the orthographic projection of the mask plate in FIG. 3 on one of the corresponding organic electroluminescent display panels.

As illustrated in FIG. 3 and FIG. 4, the embodiments of the present disclosure provide a mask plate for encapsulating a substrate 10 on which a plurality of organic electroluminescent display panels 11 are in an array arrangement, wherein the mask plate includes a first blocking area 31, a first opening area 32 and at least one encapsulation control area 33 (only one encapsulation control area 33 is illustrated in both FIG. 3 and FIG. 4) at a position corresponding to the position of each of the organic electroluminescent display panels 11.

The mask plate provided by the embodiments of the present disclosure takes a size that is capable of encapsulating the substrate 10 on which nine organic electroluminescent display panels 11 are in an array arrangement as illustrated in FIG. 3 as an example.

As illustrated in FIG. 4, an edge of an orthographic projection area of the first opening area 32 on the organic electroluminescent display panel 11 surrounds a display area 13 of the organic electroluminescent display panel 11.

The encapsulation control area 33 surrounds the first opening area 32, and includes a plurality of second opening areas 331 and a plurality of second blocking areas 332 which are alternatively arranged; the first blocking area 31 surrounds the first opening area 32, is at least between the first opening area 32 and the encapsulation control area 33, and has no overlapping area with the encapsulation control area 33; in the embodiments of the present disclosure, the first blocking area 31 may also in an area between the encapsulation control area 33 and an edge of the organic electroluminescent display panel 11; and the first blocking area 31 and the second blocking areas 332 satisfy following conditions: after encapsulating is carried out by using the mask plate, an encapsulation layer is formed in a continuous curved shape.

A mask plate provided by the embodiments of the present disclosure is configured for encapsulating a substrate on which a plurality of organic electroluminescent display panels are in an array arrangement and includes a first blocking area, a first opening area and at least one encapsulation control area at a position corresponding to each of the organic electroluminescent display panels. An edge of an orthographic projection area of the first opening area on the organic electroluminescent display panel surrounds a display area of the organic electroluminescent display panel. The encapsulation control area surrounds the first opening area, and includes a plurality of second opening areas and a plurality of second blocking areas which are alternatively arranged. The first blocking area surrounds the first opening area, is at least between the first opening area and the encapsulation control area, and has no overlapping area with the encapsulation control area. The first blocking area and the second blocking areas satisfy following conditions: after encapsulating is carried out by using the mask plate, an encapsulation layer is formed in a continuous curved shape. Because the encapsulation layer formed in the embodiments of the present disclosure is in a continuous curved shape, that is, the encapsulation layer is formed in an undulating shape, the water and oxygen intrusion path at the edge is extended. Because the encapsulation layer formed in the embodiments of the present disclosure allows the water and oxygen intrusion path at the edge to be extended, the width of the encapsulation layer at the edge provided by the embodiments of the present disclosure may be made narrower while the encapsulation layer has the same effect of resisting water and oxygen intrusion, that is, the embodiments of the present disclosure allow the width of the edge of the encapsulation film layer to be reduced, thereby achieving a narrow bezel.

In addition, after encapsulating is carried out by using the mask plate provided by the embodiments of the present disclosure, the width of the edge of the encapsulation film layer is reduced. Therefore, the encapsulation layer that extends to the cutting area 12 due to the mask shadow may be reduced, so that the cutting process subsequent to the encapsulation process would not cut the encapsulation layer generated in the area of the mask shadow, thereby improving the encapsulation effect.

As illustrated in FIG. 3, blocking is also provided by the mask plate of the embodiments of the present disclosure at a position corresponding to the cutting area 12 between two adjacent organic electroluminescent display panels 11, which is identical to the known art and is not described in detail herein.

As illustrated in FIG. 3 and FIG. 4, an orthographic projection area of the encapsulation control area 33 of the embodiments of the present disclosure on the organic electroluminescent display panel 11 has no overlapping area with a circuit bonding area of the organic electroluminescent display panel 11. In FIG. 3 and FIG. 4, the circuit bonding area of the organic electroluminescent display panel 11 is in a lower frame area of the organic electroluminescent display panel 11, and the circuit bonding area needs to be bonded to various circuits in subsequent processes and does not need to be encapsulated in the encapsulation process. The mask plate needs to be blocked in the circuit bonding area, and the configuration of the mask plate at the position corresponding to the circuit bonding area of the organic electroluminescent display panel 11 is similar to the known art and is not described in detail herein.

Certainly, in practical production processes, if there is an overlapping area between the encapsulation control area 33 and the circuit bonding area of the organic electroluminescent display panel in the embodiments of the present disclosure, the encapsulation layer formed in the circuit bonding area of the organic electroluminescent display panel is required to be removed in a subsequent circuit bonding process, which may increase the production cost and cause the problem that the bonding circuit cannot normally operate due to the incomplete removal of the encapsulation layer. Therefore, the embodiment of the present disclosure, for example, is that the orthographic projection area of the encapsulation control area on the organic electroluminescent display panel has no overlapping area with the circuit bonding area of the organic electroluminescent display panel.

As illustrated in FIG. 3 and FIG. 4, an edge of the first opening area 32 of the embodiments of the present disclosure is rectangular, one side of the rectangle is corresponding to the circuit bonding area (the lower bezel area of the organic electroluminescent display panel), and the encapsulation control area 33 surrounds remaining three sides of the rectangle, so that the encapsulation layer formed in the three bezel areas of the organic electroluminescent display panel of the embodiments of the present disclosure is in an undulating shape, thereby extending the water and oxygen intrusion path at the edge and improving the encapsulation effect in the bezel areas of the organic electroluminescent display panel.

Figure 5:
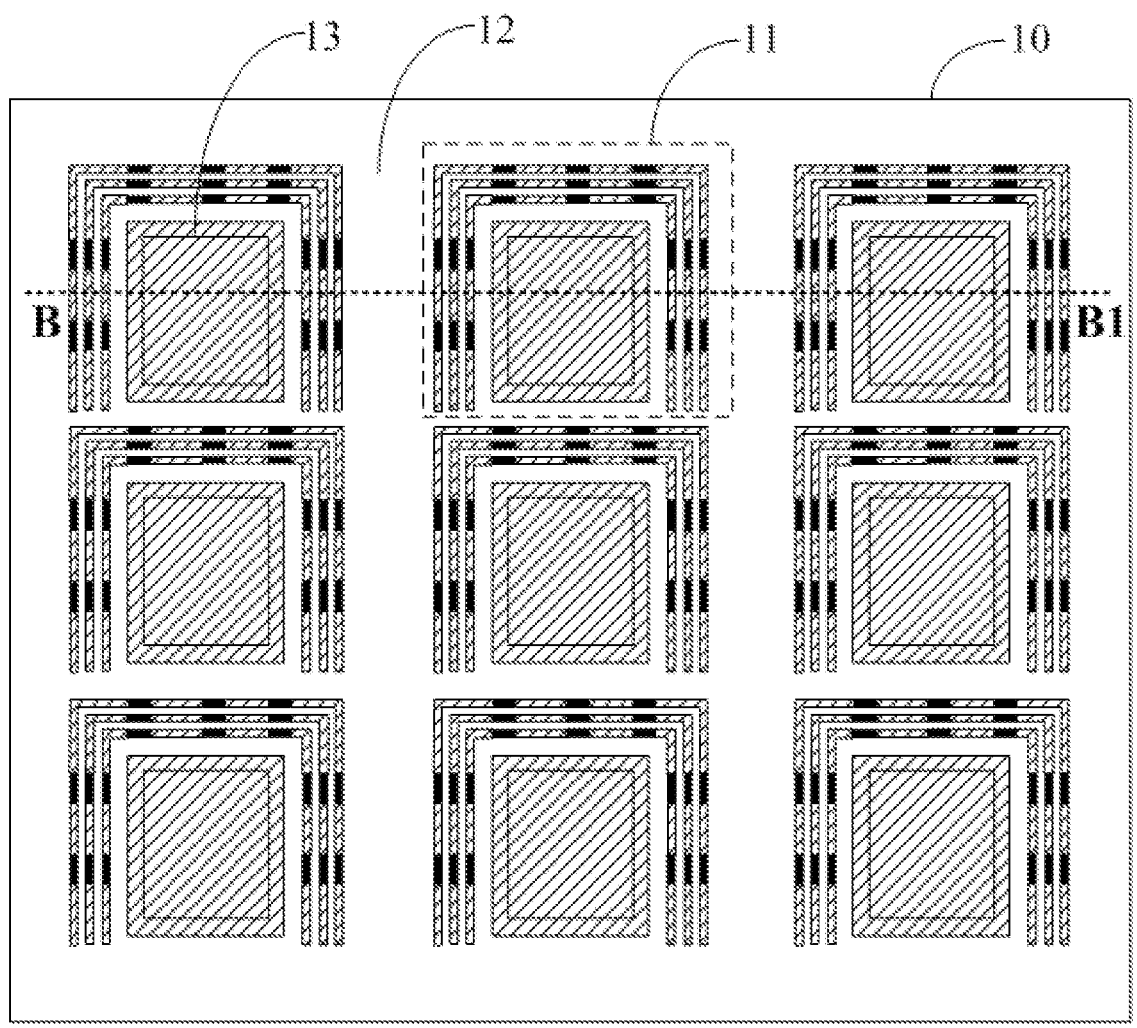
FIG. 5 is a planar schematic structural diagram of orthographic projections of another mask plate on organic electroluminescent display panels provided by the embodiments of the present disclosure.
Figure 6:
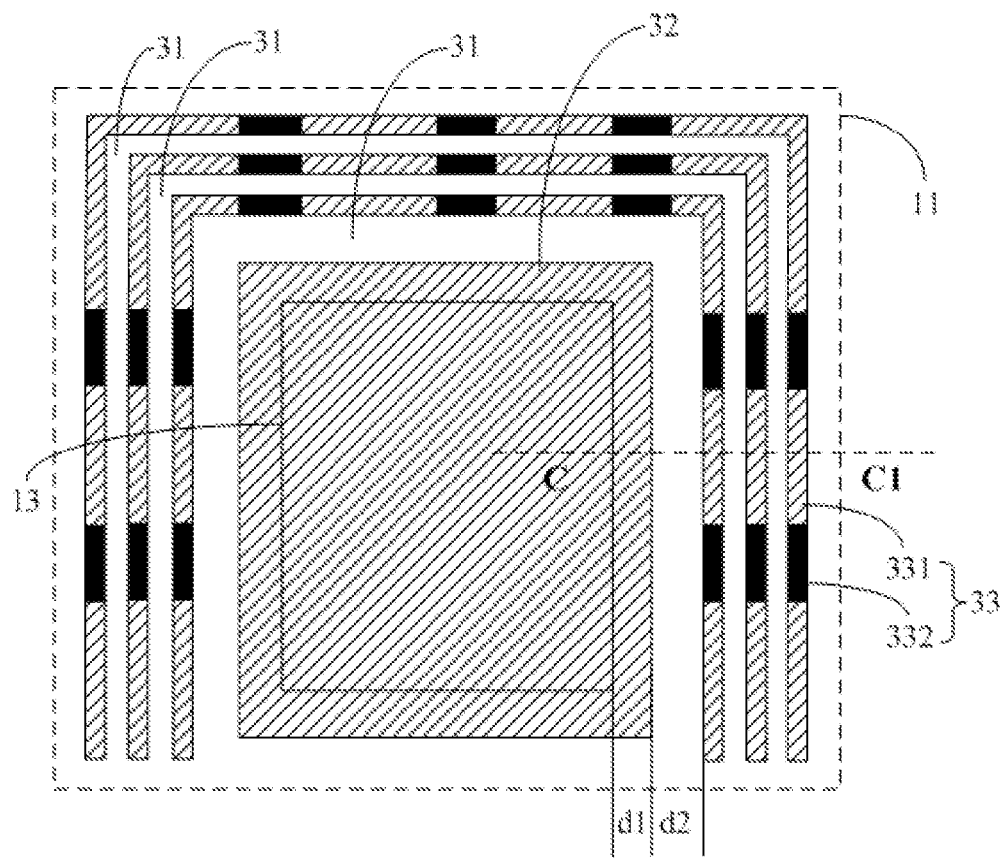
FIG. 6 is a planar schematic structural diagram of the orthographic projection of the mask plate in FIG. 5 on one of the corresponding organic electroluminescent display panels.

As illustrated in FIG. 5 and FIG. 6, where an amount of the encapsulation control areas 33 is greater than one (only the case where the amount of the encapsulation control areas 33 is three is illustrated in FIG. 5 and FIG. 6), each of the encapsulation control areas 33 extends outward centering on a center of the first opening area 32, and in a preset direction, distances between adjacent encapsulation control areas 33 are identical. In the embodiments of the present disclosure, the preset direction is a direction perpendicular to the edge of the encapsulation control areas 33, that is, for the encapsulation control areas 33 extending along the vertical direction, the preset direction is the horizontal direction, and for the encapsulation control areas 33 extending along the horizontal direction, the preset direction is the vertical direction, which is more conducive to the practical design of the mask plate and allows the encapsulation layers formed at the positions corresponding to the encapsulation control areas 33 to be in a more uniform distribution.

For example, as illustrated in FIG. 5 and FIG. 6, in the embodiments of the present disclosure, the areas of orthographic projections of the second blocking areas of the encapsulation control areas 33 on the organic electroluminescent display panel 11 are identical to each other, so that the encapsulation layers formed at the positions corresponding to the encapsulation control areas 33 are in a more uniform distribution and this design method is more conducive to the fabrication of the encapsulation control areas 33 of the mask plate.

For example, as illustrated in FIG. 5 and FIG. 6, in order to allow the resisting water and oxygen intrusion path of the encapsulation layer at the edge of the organic electroluminescent display panel to be longer, in the embodiments of the present disclosure, the first blocking areas 31 are between the first opening area 32 and the encapsulation control areas 33, and between adjacent encapsulation control areas 33.

Figure 7:
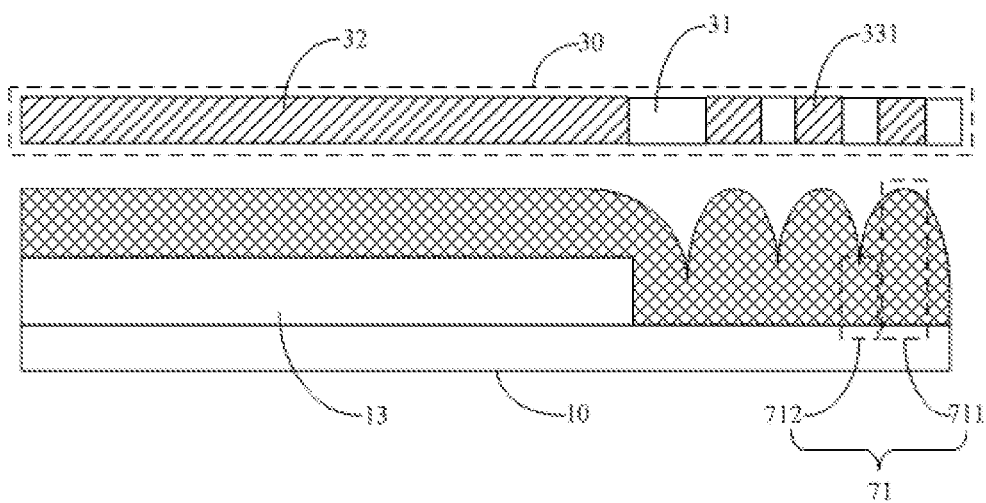
FIG. 7 is a cross-sectional schematic structural diagram of an encapsulation layer that is formed after the organic electroluminescent display panel is encapsulated by using the mask plate illustrated in FIG. 6 along a CC1 direction in FIG. 6.

As illustrated in FIG. 7, after the substrate on which a plurality of organic electroluminescent display panels 11 are in an array arrangement is encapsulated by using the mask plate 30 of the embodiments of the present disclosure, an encapsulation layer 71 of the organic electroluminescent display panel 11 at a position corresponding to the mask plate 30 along the CC1 direction in FIG. 6 is formed, wherein a second encapsulation layer 712 with a smaller thickness is formed at a position corresponding to a position of the first blocking area 31, a first encapsulation layer 711 with a larger thickness is formed at a position corresponding to a position of the first opening area 32, first encapsulation layers 711 with a larger thickness are formed at positions corresponding to positions of the second opening areas 331, and the first encapsulation layers 711 and the second encapsulation layer 712 are in an undulating shape, thereby extending the water and oxygen intrusion path at the edge.

Figure 8:
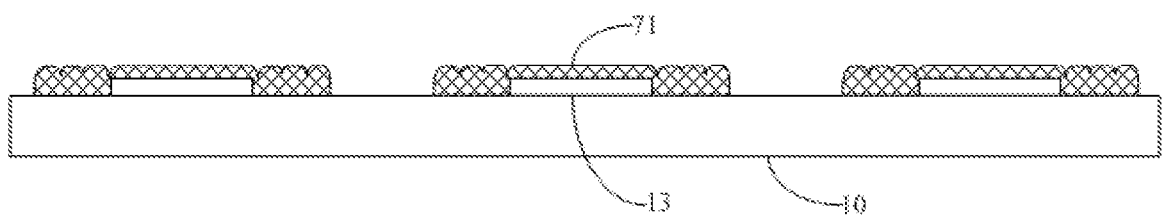
FIG. 8 is a cross-sectional schematic structural diagram of encapsulation layers which are formed after the organic electroluminescent display panels are encapsulated by using the mask plate illustrated in FIG. 5 along a BB1 direction in FIG. 5.

FIG. 8 is a cross-sectional schematic structural diagram of encapsulation layers 71 of the organic electroluminescent display panels 11 at corresponding positions along the BB1 direction in FIG. 5, which are formed after the substrate on which a plurality of organic electroluminescent display panels 11 are in an array arrangement is encapsulated by using the mask plate 30 illustrated in FIG. 5. It can be seen from the figure that after encapsulating is carried out by using the mask plate provided by the embodiments of the present disclosure, the encapsulation layers 71 are formed in an undulating shape in the edge areas of the organic electroluminescent display panels 11, thereby extending the water and oxygen intrusion path at the edge. Therefore, in the practical encapsulation processes, wide encapsulation bezels are not required, thereby achieving the design of narrow bezels.

The setting parameters of each area in the mask plate of the embodiments of the present disclosure are described in the following.

As illustrated in FIG. 6, in the embodiments of the present disclosure, the function of the first blocking areas 31 and the second blocking areas 332 is to form the mask shadow, which allows the encapsulation layers to be formed in an undulating shape in the edge area of the organic electroluminescent display panel, thereby extending the water and oxygen intrusion path at the edge. Therefore, the opening width of the first opening area 32 in the embodiments of the present disclosure may also be reduced. For example, in the embodiments of the present disclosure, a distance d1 between the edge of the orthographic projection area of the first opening area 32 on the organic electroluminescent display panel 11 and an edge of the display area 13 is 10 microns to 200 microns.

For example, as illustrated in FIG. 6, in order to ensure that the encapsulation layers 71 of the embodiments of the present disclosure are formed in an undulating shape, in the embodiments of the present disclosure, a distance d2 between an edge of the first opening area 32 and an edge of the encapsulation control area 33 closest to the first opening area 32 is at least 10 microns; and besides, in order to ensure that the encapsulation layers 71 are formed in a continuous shape without interruption, d2 cannot be greater than 300 microns.

As illustrated in FIG. 6, for any of the encapsulation control areas 33, the encapsulation control area 33 includes a plurality of second opening areas 331 and a plurality of second blocking areas 332 which are arranged alternatively, the encapsulation layers with a larger thickness are formed at positions corresponding to the second opening areas 331, and the encapsulation layers with a smaller thickness are formed at positions corresponding to the second blocking areas 332. In order to ensure that the encapsulation layers of the embodiments of the present disclosure are formed in an undulating shape and are also formed in a continuous distribution, in the embodiments of the present disclosure, the opening widths of the second opening areas 331 in the preset direction are from a few of microns to tens of microns. The preset direction here is the direction perpendicular to the edge of the encapsulation control area, and in the preset direction, the widths of the second blocking areas 332 are identical to the opening widths of the second opening areas 331. In the embodiments of the present disclosure, in the direction perpendicular to the preset direction, the lengths of the second blocking areas 332 are from tens of microns to 200 microns.

In addition, as illustrated in FIG. 6, in the preset direction, distances between adjacent encapsulation control areas 33 are identical. The preset direction here is the direction perpendicular to the edge of the encapsulation control area. In practical design, in order to ensure that the encapsulation layers of the embodiments of the present disclosure are formed in an undulating shape and are also formed in a continuous distribution, in the embodiments of the present disclosure, the distances between adjacent encapsulation control areas 33 are from tens of microns to 200 microns.

The embodiments of the present disclosure further provide a method for encapsulating an organic electroluminescent display panel, and the encapsulation method includes an encapsulation process of an inorganic encapsulation layer and an encapsulation process of an organic encapsulation layer. In the embodiments of the present disclosure, at least one inorganic encapsulation layer is formed by using the mask plate described in the above embodiments; and/or, at least one organic encapsulation layer is formed by using the mask plate described in the above embodiments.

In the embodiments of the present disclosure, the encapsulation process of the inorganic encapsulation layer and the encapsulation process of the organic encapsulation layer are both similar to the know art. An organic layer deposition technology may be applied for the organic encapsulation layer, such as: printing, coating, vacuum coating, thermal evaporation, etc. An inorganic layer coating technology may be applied for the inorganic encapsulation layer, such as: plasma vapor deposition technology, magnetron sputtering technology, atomic layer deposition technology, etc. The organic encapsulation layers and the inorganic encapsulation layers are stacked alternatively, one inorganic encapsulation layer and one organic encapsulation layer form a structure group, and the thin-film encapsulation process in the embodiments of the present disclosure uses at least one structure group including one inorganic encapsulation layer and one organic encapsulation layer.

Because in the embodiments of the present disclosure, at least one inorganic encapsulation layer is formed by using the mask plate described in the above embodiments, and/or, at least one organic encapsulation layer is formed by using the mask plate described in the above embodiments, the inorganic encapsulation layer and/or the organic encapsulation layer formed in the embodiments of the present disclosure can extend the water and oxygen intrusion path at the edge. Therefore, in practical encapsulation processes, wide encapsulation bezels are not required, thereby achieving the design of narrow bezels.

Another embodiment of the present disclosure further provides an organic electroluminescent display panel, including an anode layer, a light-emitting layer, a cathode layer, an inorganic encapsulation layer and an organic encapsulation layer, wherein at least one of the inorganic encapsulation layer is formed by the encapsulation method described in the above embodiments; and/or, at least one of the organic encapsulation layer is formed by the encapsulation method described in the above embodiments. The inorganic encapsulation layer and/or the organic encapsulation layer formed by the encapsulation method described in the above embodiments can extend the water and oxygen intrusion path at the edge. Therefore, in the practical encapsulation process, wide encapsulation bezels are not required, thereby achieving the design of narrow bezels and also solving the technical problems of water permeation at the edge and edge bending of the organic electroluminescent display panel.

In summary, the embodiments of the present disclosure provide a mask plate for encapsulating a substrate on which a plurality of organic electroluminescent display panels are in an array arrangement, including a first blocking area, a first opening area and at least one encapsulation control area at a position corresponding to each of the organic electroluminescent display panels, wherein an edge of an orthographic projection area of the first opening area on the organic electroluminescent display panel surrounds a display area of the organic electroluminescent display panel; during the encapsulation process, an encapsulation layer with a larger thickness is correspondingly formed at a position of the first opening area; the encapsulation control area surrounds the first opening area, and includes a plurality of second opening areas and a plurality of second blocking areas which are arranged alternatively; during the encapsulation process, encapsulation layers with a larger thickness are correspondingly formed at positions of the second opening areas, and encapsulation layers with a smaller thickness are correspondingly formed at positions of the second blocking areas; the first blocking area surrounds the first opening area, is at least between the first opening area and the encapsulation control area, and has no overlapping area with the encapsulation control area; and during the encapsulation process, an encapsulation layer with a smaller thickness is correspondingly formed at a position of the first blocking area. Because the encapsulation layers of the embodiments of the present disclosure are formed in a continuous curved shape, the encapsulation layers with different thicknesses are in an undulating shape and allow the water and oxygen intrusion path at the edge to be extended. Because the encapsulation layers formed in the embodiments of the present disclosure can allow the water and oxygen intrusion path at the edge to be extended, the width of the encapsulation layer at the edge provided by the embodiments of the present disclosure can be made narrower while the encapsulation layers have the same effect of resisting water and oxygen intrusion, that is, the embodiments of the present disclosure allow the width of the edge of the encapsulation film layer to be reduced, thereby achieving a narrow bezel.

The foregoing merely are exemplary embodiments of the disclosure, and not intended to define the scope of the disclosure, and the scope of the disclosure is determined by the appended claims.

What is claimed is:

1. A mask plate for encapsulating a substrate, a display panel being on the substrate, the mask plate comprising a first blocking area, a first opening area and an encapsulation control area at a position corresponding to the display panel,
wherein an edge of an orthographic projection of the first opening area on the display panel surrounds a display area of the display panel,
the encapsulation control area surrounds the first opening area, and comprises a plurality of second opening areas and a plurality of second blocking areas which are arranged alternatively, and
the first blocking area surrounds the first opening area, is between the first opening area and the encapsulation control area, and has no overlapping area with the encapsulation control area.

2. The mask plate according to claim 1, wherein an orthographic projection of the encapsulation control area on the display panel has no overlapping area with a circuit bonding area of the display panel.

3. The mask plate according to claim 2, wherein a shape of an edge of the first opening area is a rectangle, one side of the rectangle corresponds to the circuit bonding area, and the encapsulation control area surrounds remaining three sides of the rectangle.

4. The mask plate according to claim 3, wherein an amount of the encapsulation control area is greater than one, the encapsulation control areas are distributed outward centering on a center of the first opening area.

5. The mask plate according to claim 2, wherein an amount of the encapsulation control area is greater than one, the encapsulation control areas are distributed outward centering on a center of the first opening area.

6. The mask plate according to claim 1, wherein an amount of the encapsulation control area is greater than one, the encapsulation control areas are distributed outward centering on a center of the first opening area.

7. The mask plate according to claim 6, wherein the first blocking area is additionally between adjacent encapsulation control areas.

8. The mask plate according to claim 6, wherein areas of orthographic projections of the second blocking areas of the encapsulation control areas on the display panel are identical to each other.

9. The mask plate according to claim 6, wherein a distance between the edge of the orthographic projection of the first opening area on the display panel and an edge of the display area is approximately 10 microns to 200 microns.

10. The mask plate according to claim 6, wherein a distance between an edge of the first opening area and an edge of the encapsulation control area closest to the first opening area is approximately 10 microns to 300 microns.

11. The mask plate according to claim 6, wherein an amount of the encapsulation control area is greater than two, and in a preset direction, distances between adjacent encapsulation control areas are identical.

12. The mask plate according to claim 1, wherein the orthographic projection of the first opening area on the display panel has no overlapping area with a circuit bonding area of the display panel.

13. The mask plate according to claim 1, wherein a length of the second blocking area in a direction perpendicular to a present direction is approximately tens of microns to 200 microns.

14. The mask plate according to claim 1, wherein the second opening area and the second blocking area have an identical width in a preset direction.

15. A method of encapsulating a display panel, comprising forming an encapsulating layer by using a mask plate,
wherein the mask plate is configured for encapsulating a substrate, a display panel being on the substrate, the mask plate comprising a first blocking area, a first opening area and an encapsulation control area at a position corresponding to the display panel,
an edge of an orthographic projection of the first opening area on the display panel surrounds a display area of the display panel, the encapsulation control area surrounds the first opening area, and comprises a plurality of second opening areas and a plurality of second blocking areas which are arranged alternatively,
the first blocking area surrounds the first opening area, is between the first opening area and the encapsulation control area, and has no overlapping area with the encapsulation control area, and
the encapsulation layer is formed in an undulating shape.

16. A display panel, comprising an anode layer, a light-emitting layer, a cathode layer, an inorganic encapsulation layer and an organic encapsulation layer, wherein at least one selected from a group consisting of the inorganic encapsulation layer and the organic encapsulation layer is formed by the method according to claim 15.

17. The method according to claim 15, wherein the encapsulation layer comprises at least one selected from a group consisting of an organic encapsulation layer and an inorganic encapsulation layer.

* * * * *